US011664641B2

(12) United States Patent
Dejima et al.

(10) Patent No.: US 11,664,641 B2
(45) Date of Patent: May 30, 2023

(54) LIGHT SOURCE DEVICE

(71) Applicant: NICHIA CORPORATION, Anan (JP)

(72) Inventors: Norihiro Dejima, Yokohama (JP);
Masaki Omori, Toshima-ku (JP)

(73) Assignee: NICHIA CORPORATION, Anan (JP)

( * ) Notice: Subject to any disclaimer, the term of this patent is extended or adjusted under 35 U.S.C. 154(b) by 214 days.

(21) Appl. No.: 17/306,417

(22) Filed: May 3, 2021

(65) Prior Publication Data
US 2021/0265817 A1     Aug. 26, 2021

Related U.S. Application Data

(62) Division of application No. 16/367,121, filed on Mar. 27, 2019, now Pat. No. 11,031,750.

(30) Foreign Application Priority Data

Mar. 28, 2018 (JP) .............................. JP2018-061647

(51) Int. Cl.
*G02B 27/10*     (2006.01)
*H01S 5/14*     (2006.01)
(Continued)

(52) U.S. Cl.
CPC ............ *H01S 5/141* (2013.01); *G02B 5/0278* (2013.01); *G02B 5/1866* (2013.01);
(Continued)

(58) Field of Classification Search
CPC .............. G02B 27/1086; G02B 5/0278; G02B 5/1866; H01S 5/141; H01S 5/14; H01S 5/06; H01S 5/4012; H01S 5/02212
(Continued)

(56) References Cited

U.S. PATENT DOCUMENTS 6,321,001 B1    11/2001   Heflinger
6,819,703 B1    11/2004   Omura et al.
(Continued)

FOREIGN PATENT DOCUMENTS

JP     S60-108802 A    6/1985
JP     H05-206561 A    8/1993
(Continued)

OTHER PUBLICATIONS

Notice of Allowance in U.S. Appl. No. 16/367,121 dated Mar. 30, 2021.

*Primary Examiner* — William R Alexander
(74) *Attorney, Agent, or Firm* — Foley & Lardner LLP

(57) ABSTRACT

A light source device includes: a plurality of laser sources; a plurality of collimating parts, each configured to collimate the light beam emitted from a corresponding one of the laser sources; a combining grating configured to diffract, at an identical diffraction angle, light beams that have passed through the collimating parts and are incident on the combining grating at different incident angles to combine the diffracted light beams; and a plurality of volume holographic gratings, wherein each of the volume holographic gratings is disposed in an optical path between a corresponding one of the laser sources and the combining grating, wherein each of the volume holographic gratings determines a wavelength of the light beam incident on the combining grating, and wherein each of the volume holographic gratings is configured to diffract a portion of the light beam emitted from a corresponding laser source back to the laser source.

7 Claims, 4 Drawing Sheets

(51) Int. Cl.
  *G02B 5/02* (2006.01)
  *H01S 5/40* (2006.01)
  *G02B 5/18* (2006.01)
  *H01S 5/02212* (2021.01)
(52) U.S. Cl.
  CPC ........ *G02B 27/1086* (2013.01); *H01S 5/4012* (2013.01); *H01S 5/02212* (2013.01)
(58) Field of Classification Search
  USPC .......................................................... 359/569
  See application file for complete search history.

(56) References Cited

U.S. PATENT DOCUMENTS

| | | | |
|---|---|---|---|
| 8,035,895 B2 | 10/2011 | Taira et al. | |
| 9,627,852 B2* | 4/2017 | Hemenway | H01S 5/187 |
| 2003/0206336 A1 | 11/2003 | Onaka et al. | |
| 2009/0010001 A1 | 1/2009 | Kamijima et al. | |
| 2009/0252185 A1 | 10/2009 | Kamijima et al. | |
| 2010/0193710 A1 | 8/2010 | Wakabayashi et al. | |
| 2010/0225852 A1 | 9/2010 | Taira et al. | |
| 2011/0216792 A1 | 9/2011 | Chann et al. | |
| 2012/0012762 A1 | 1/2012 | Nowak et al. | |
| 2013/0094529 A1 | 4/2013 | Wakabayashi | |
| 2013/0099140 A1 | 4/2013 | Nakarai et al. | |
| 2013/0148674 A1 | 6/2013 | Nowak et al. | |
| 2014/0241388 A1 | 8/2014 | Yamanaka et al. | |
| 2015/0222082 A1 | 8/2015 | Hunter et al. | |
| 2015/0295386 A1* | 10/2015 | Hemenway | H01S 5/4012 |
| | | | 372/46.01 |
| 2016/0054281 A1 | 2/2016 | Smeeton et al. | |
| 2016/0172823 A1* | 6/2016 | Hemenway | H01S 5/026 |
| | | | 372/46.01 |
| 2017/0097329 A1 | 4/2017 | Smeeton et al. | |
| 2017/0288364 A1* | 10/2017 | Hemenway | H01S 5/1014 |
| 2018/0306952 A1 | 10/2018 | Marutani | |
| 2019/0011881 A1 | 1/2019 | Tan et al. | |
| 2019/0020178 A1 | 1/2019 | Oguri et al. | |
| 2019/0058305 A1* | 2/2019 | Hemenway | H01S 5/2036 |

FOREIGN PATENT DOCUMENTS

| | | |
|---|---|---|
| JP | H08-086689 A | 4/1996 |
| JP | H11-289130 A | 10/1999 |
| JP | 2003-324227 A | 11/2003 |
| JP | 2008-191649 A | 8/2008 |
| JP | 2010-171375 A | 8/2010 |
| JP | 2011-205061 A | 10/2011 |
| JP | 2012-182434 A | 9/2012 |
| JP | 2012-216768 A | 11/2012 |
| JP | 2012-216769 A | 11/2012 |
| JP | 2013-521666 A | 6/2013 |
| JP | 2016-054295 A | 4/2016 |
| JP | 2017-204530 A | 11/2017 |
| JP | 2017-532535 A | 11/2017 |
| WO | WO-2005/085947 A1 | 9/2005 |
| WO | WO-2013/080396 A1 | 6/2013 |
| WO | WO-2015/115301 A1 | 8/2015 |
| WO | WO-2014/087726 A1 | 1/2017 |
| WO | WO-2017/134911 A1 | 8/2017 |

* cited by examiner

LIGHT SOURCE DEVICE

CROSS-REFERENCE TO RELATED APPLICATIONS

The present application is a divisional of U.S. patent application Ser. No. 16/367,121, filed on Mar. 27, 2019, which claims priority to Japanese Patent Application No. 2018-061647, filed on Mar. 28, 2018. The contents of these applications are hereby incorporated by reference in their entireties.

BACKGROUND OF THE INVENTION

1. Field of the Invention

The present disclosure relates to a light source device that applies wavelength beam combining (WBC) to emit high-output laser light.

2. Description of Related Art

Demand for light source devices to emit high-output laser light has increased in various fields including laser processing such as laser soldering. One example of light source devices to emit high-output laser light is a wavelength beam combining device (hereinafter referred to as a "WBC device"). U.S. Pat. No. 6,192,062 describes an example of a WBC device. The WBC device described in U.S. Pat. No. 6,192,062 includes: a light source unit, such as a laser diode (LD) bar, in which a plurality of laser sources (for example, LDs) are arranged and each of the laser sources are configured to emit light with a predetermined gain spectral bandwidth; a collimating lens that collimates laser beams emitted from the laser sources; a condenser lens that condenses the laser beams passing through the collimating lens; a grating on which the laser beams condensed by the condenser lens is incident; and a partially reflecting mirror that is disposed in an optical path of diffracted beams diffracted by the grating. The partially reflecting mirror and each of the plurality of laser sources form an external cavity, and lights resonated in external cavities are each transmitted through partially reflecting mirrors and are combined.

SUMMARY OF THE INVENTION

In the WBC device, portions of the diffracted beams from the grating are reflected by the partially reflecting mirror and are returned back into the laser source. However, the light source device with the above structure has a great external cavity length between the laser source and the partially reflecting mirror. In one example, the external cavity length is approximately 1 meter. With a great external cavity length, even a slight deviation in position of an optical element constituting the external cavity due to vibration causes a great deviation of the light beam. This may result in a failure of external resonance, and thus the WBC device may not work.

One object of the present invention is to provide a light source device in which the external cavity length can be shortened.

A light source device according to one embodiment of the present invention includes: a plurality of laser sources each configured to emit light having a peak wavelength in a range of 350 nm to 550 nm with a predetermined gain bandwidth; collimating parts each configured to collimate light emitted from a corresponding one of the laser sources into a substantially parallel light; a combining grating configured to diffract, at an identical diffraction angle, lights that have passed through the collimating part and are incident on the combining grating at different incident angles, to combine the diffracted lights; and plane transmission gratings each disposed in an optical path between a corresponding one of the collimating parts and the combining grating, each of the plane transmission gratings is adjustable so as to allow selection of a wavelength of the light incident on the combining grating. Each of the plane transmission gratings is configured to diffract a portion of light emitted from a corresponding one of the laser sources back to the corresponding one of the laser sources, to cause external resonance between the corresponding one of the laser sources and each of the plane transmission gratings.

A light source device according to another embodiment of the present invention includes: a plurality of laser sources each configured to emit light having a peak wavelength in a range of 350 nm to 550 nm with a predetermined gain bandwidth; collimating parts each configured to collimate the light emitted from a corresponding one of the laser sources into a substantially parallel light; a combining grating configured to diffract, at an identical diffraction angle, lights that have passed through the collimating part and are incident on the combining grating at a different incident angle to combine the diffracted light; and volume holographic gratings each disposed in an optical path between a corresponding one of the laser sources and the combining grating, each of the volume holographic gratings determines a wavelength of the light incident on the combining grating. Each of the volume holographic gratings is configured to diffract a portion of the light emitted from a corresponding one of the laser sources back to the laser source, to cause external resonance between the corresponding one of the laser sources and each of the volume holographic gratings.

A light source device according to yet another embodiment of the present invention includes: a plurality of laser sources each configured to emit light having a peak wavelength in a range of 350 nm to 550 nm with a predetermined gain bandwidth; collimating parts each configured to collimate an incident light into a substantially parallel light; a combining grating configured to diffract, at an identical diffraction angle, lights each having passed through a corresponding one of the collimating parts and incident on the combining grating at different incident angles, to combine the diffracted light; and fiber Bragg gratings each disposed in an optical path between a corresponding one of the laser sources and a corresponding one of the collimating parts, each of the fiber Bragg gratings determines a wavelength of a light incident on the combining grating. Each of the fiber Bragg gratings is configured to diffract a portion of the light emitted from a corresponding one of the laser sources back to the corresponding laser source, to cause external resonance between the corresponding one of the laser sources and each of the fiber Bragg gratings.

According to certain embodiments, a light source device having a short external cavity length can be provided.

Problems, configurations, and effects other than the above will become apparent from the following description of certain embodiments.

DETAILED DESCRIPTION OF EMBODIMENTS

Certain embodiments of the present invention will be described below with reference to the drawings.

First Embodiment

Figure 1:
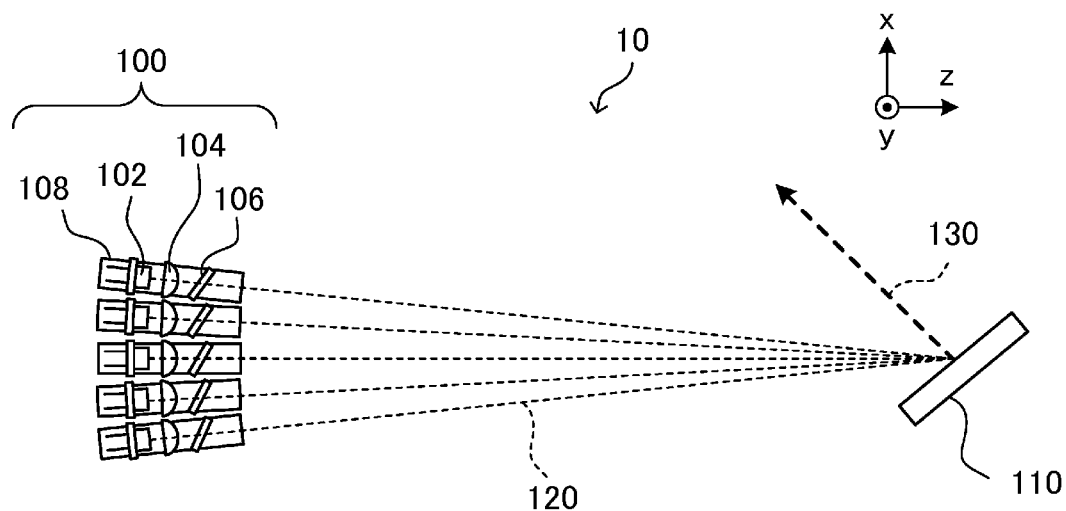
FIG. 1 is a schematic view of a light source device according to a first embodiment of the present invention.

FIG. 1 is a schematic view of a light source device according to a first embodiment of the present invention. A light source device 10 of the present embodiment includes a plurality of external cavity modules 100 and a combining grating 110. Each of the external cavity modules 100 includes a laser source 102, a collimating part 104, a plane transmission grating 106, and a stage 108. In each external cavity module 100, the laser source 102, the collimating part 104, and the plane transmission grating 106 are disposed at the same stage 108, so that the external cavity module 100 can be moved integrally. In this case, the laser source 102 is preferably disposed in contact with the stage 108 to allow the laser source 102 to be cooled by cooling the stage 108.

An x axis, a y axis, and a z axis, which are orthogonal to one another, are shown in FIG. 1 for the convenience of description. In FIG. 1, light beams are schematically represented in dashed lines and denoted as light beams 120. Each of the light beams 120 shown in dashed lines is emitted from the laser source 102, passes through the collimating part 104 and the plane transmission grating 106, and then enters the combining grating 110. Although a light beam has a divergence angle or a width, only the optical axis of the beam is shown in dashed lines in FIG. 1 for the convenience of description.
All of the light beams 120 have their optical axes on a single x-z plane.

The laser source 102 may be a laser diode (hereinafter referred to as "LD") configured to emit light having a peak wavelength in a range of 350 nm to 550 nm with a predetermined gain bandwidth. For example, the laser source 102 may be an LD including a nitride semiconductor configured to emit light having a center wavelength of 410 nm with a gain bandwidth $\Delta\lambda$ of 20 nm. In this case, the wavelength of light emitted from the laser source 102 is in a range of 400 nm to 420 nm.

When the LD serving as the laser source 102 has a front side from which light is emitted and a rear side opposite to the front side, it is preferable that the front side is provided with an antireflective coating to have a reflectance reduced to nearly 0%, for example, approximately in a range of 0.1% to 2.0%. The rear mirror preferably has a reflectance of nearly 100%, for example, 85% to 99.9%. Because the LD to emit light having a wavelength in a range of 350 nm to 550 nm tends to be deteriorated in the air, the laser source 102 is preferably hermetically sealed. For example, an LD in a can-type package may be used for the laser source 102. Using the can-type package for the laser source 102 allows for further having an effect of cooling and an effect of electrostatic and electromagnetic shielding.

Each collimating part 104 is configured to collimate individual light emitted from a corresponding one of the laser sources 102 into substantially parallel light. Each collimating part 104 may be, for example, a collimating lens disposed opposing a corresponding one of the laser sources 102. Each collimating part 104 corresponding to a corresponding one of the laser sources 102 may be a single lens or a plurality of lenses in combination.

Each plane transmission grating 106 is disposed in an optical path between the collimating part 104 and the combining grating 110 of the same external cavity module 100. Each plane transmission grating 106 is configured to diffract a portion of light emitted from the laser source 102 of the same external cavity module 100 back to the laser source 102, to cause external resonance between the laser source 102 and the corresponding plane transmission grating 106. In more detail, the external resonance occurs between the rear side of the LD that serves as the laser source 102 and the plane transmission grating 106. That is, a combination of the laser source 102, the collimating part 104, and the plane transmission grating 106 forms a single external cavity. The cavity length of the external cavity is defined by the distance between the laser source 102 and the plane transmission grating 106. The external cavity may have a Littrow configuration. The "Littrow configuration" refers to a configuration that allows light to be diffracted at the same angle as an incident angle and the diffracted light being reflected is fed back to the laser diode along the same route as the incident light.

The plane transmission grating 106 having grating grooves is disposed such that the orientation of the grating grooves is parallel to the y axis as shown in FIG. 1. The plane transmission grating 106 has a rotation axis parallel to the y axis and is disposed on the stage 108 so as to be rotated about the rotation axis with respect to the stage 108. When the plane transmission grating 106 is rotated about the rotation axis, the incident angle at which the light emitted from the laser source 102 enters the plane transmission grating 106 changes, so that the wavelength of light resonating in a corresponding external cavity may be selected. Accordingly, the plane transmission grating determines the wavelength of light passing through the plane transmission grating 106 and incident on the combining grating 110. That is, the plane transmission grating 106 serves as a wavelength selecting element for the external cavity. Rotation of the plane transmission grating 106 may be controlled by a known driving unit in the art, such as a stepper motor.

As shown in FIG. 1, the light passing through the plane transmission grating 106 of the external cavity module 100 enters the combining grating 110 at a different incident angle. In FIG. 1, the light beam 120 is shown in the dashed line extending from the plane transmission grating 106 to the combining grating 110.
For the convenience of description, the light beam 120 is also referred to as the light emitted from the external cavity module 100 in the present specification. The incident angle of each light beam 120 entering the combining grating 110 is defined by the mounting angle of a corresponding external cavity in which the external resonance occurs. More specifically, the incident angle of each light beam 120 can be set and adjusted by selecting the position and the angle of a corresponding one of the external cavity modules 100 relative to the combining grating 110. For example, the angle of the external cavity module 100 as a whole can be adjusted by rotating the stage 108, so that the incident angle of the light entering the combining grating 110 can be adjusted. Such an adjustment can be performed by a known device in the art, such as a stepper motor.

The combining grating 110 has grating grooves and is disposed such that the orientation of the grating grooves is parallel to the y axis shown in FIG. 1. The combining grating 110 is configured to diffract the light beams 120, each of which passes through the collimating part 104 and the plane transmission grating 106 of a corresponding external cavity module 100 and which enter the combining grating 110 at different incident angles, toward the same diffraction angle to combine the light beam 120 so as to form a combined beam 130. The combined beam 130 has an optical axis on the x-z plane, on which the optical axes of the light beams 120 are also located. Next, diffracting of the combining grating 110 will be described with reference to FIG. 2.

Figure 2:
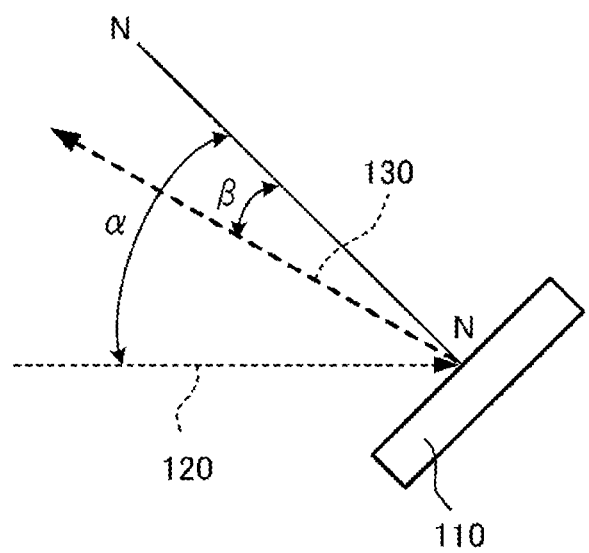
FIG. 2 is a schematic view illustrating the incident angle of incident light entering a combining grating and the diffraction angle of diffracted light.

FIG. 2 is a schematic view illustrating the incident angle of the light entering the combining grating 110 and the diffraction angle of the diffracted light. In FIG. 2, a solid line N-N indicates a normal of the combining grating 110. Assuming the light beam 120 enters the combining grating 110 at an incident angle of a and the diffracted beam (the combined beam 130) is diffracted by the combining grating 110 at a diffraction angle of β, the relationship expressed in Formula (1) is satisfied.

$$\sin \alpha + \sin \beta = N \cdot m \cdot \lambda \quad \text{Formula (1)}$$

In Formula (1), a indicates the incident angle, β indicates the diffraction angle, N indicates the number of grooves in the combining grating per 1 mm, m indicates an order of diffraction, and λ indicates the wavelength of the light beam.

For example, provided that each of the laser sources 102 is configured to emit a laser beam with a center wavelength of 410 nm and a wavelength in range of 400 nm to 420 nm and the combining grating has 2,222 grooves per 1 mm, a first order diffraction occurs such that, when each of the light beams having wavelengths shown in Table 1 enters the combining grating at the corresponding incident angle α, the light beams are diffracted at the same diffraction angle β, so as to form the combined beam.

TABLE 1

| λ (nm) | α (degree) | β (degree) |
|---|---|---|
| 400.53 | 43.32 | 11.77 |
| 405.30 | 44.16 | 11.77 |
| 410.00 | 45.00 | 11.77 |
| 414.63 | 45.84 | 11.77 |
| 419.19 | 46.68 | 11.77 |

That is, with the plane transmission grating 106, a wavelength of a light emitted from each of the external cavity modules 100 is selected to be a corresponding one of 400.53 nm, 405.30 nm, 410.00 nm, 414.63 nm, or 419.19 nm, which are in the column of the wavelength "λ" in Table 1.

Then, the position of the external cavity module 100 is adjusted such that light enters the combining grating 110 at the corresponding incident angle shown in the column of the incident angle "α" in Table 1, namely, 43.32 degrees, 44.16 degrees, 45.00 degrees, 45.84 degrees, or 46.68 degrees. Accordingly, the lights emitted from the external cavity modules 100 are diffracted by the combining grating 110 at the same diffraction angle of 11.77 degrees, so that the high-output combined beam 130 is formed.

FIG. 1 illustrates an example in which a reflection grating is used for the combining grating 110; however, a transmission grating may be used for the combining grating 110. The transmission grating absorbs less light compared with the reflection grating, and thus is less easily damaged. With the reflection grating, only a zero-order reflecting light and a first-order diffracted light is obtained, which allows the stray light to be reduced.

In the present embodiment, the external cavity is formed between the laser source 102 and the plane transmission grating 106 in each external cavity module 100, so that a single longitudinal mode oscillation at the selected wavelength is obtained. The length of the external cavity is defined by a distance between the laser source 102 and the plane transmission grating 106. Reduction in the distance between the laser source 102 and the plane transmission grating 106 increases a tolerance of deviation of the position of optical elements that constitute the external cavity is, which enables the light source device 10 to have a high vibration resistance. For example, along with increase in output of a light source device, a water-cooling system is required for the light source device; however, the operation of the external cavity may become unstable due to the pulsation of cooling water. Also, an external cavity with a long cavity length requires precise adjustment during initial assembly, which leads to the difficulty in the assembly. According to the present embodiment, such a high precision adjustment is not required during initial assembly, so that the light source device can be easily assembled.

Second Embodiment

Figure 3:
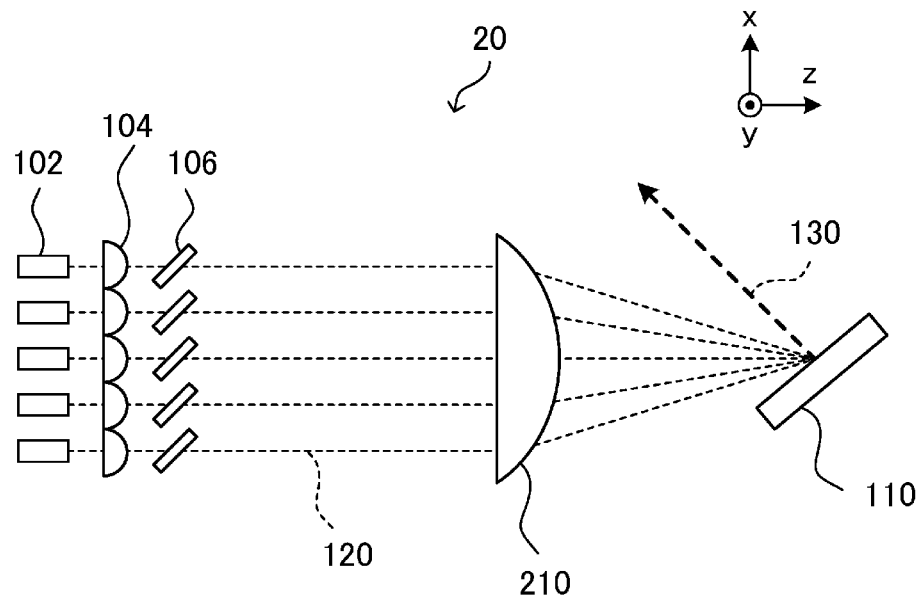
FIG. 3 is a schematic view of a light source device according to a second embodiment of the present invention.

FIG. 3 is a schematic view of a light source device according to a second embodiment of the present invention. A light source device 20 in the present embodiment is a modification of the light source device 10. In the present embodiment, members, portions, components, and elements having the same functions as the first embodiment are denoted by the same reference numerals as those in the first embodiment, and duplicative description thereof may be omitted.

The light source device 20 includes a plurality of laser sources 102 as in the light source device 10. Each of the laser sources 102 includes a collimating part 104 and a plane transmission grating 106. The plane transmission grating 106 is configured to diffract a portion of light emitted from the corresponding laser source 102 back to the laser source 102 to cause external resonance between the laser source 102 and the plane transmission grating 106. That is, the laser source 102, the collimating part 104, and the plane transmission grating 106 form an external cavity.

The light source device 20 is different from the light source device 10 mainly in the aspects described below. A deflector-condenser lens 210 is disposed in an optical path between the external cavities and a combining grating 110. Light beams 120, which pass through the plane transmission gratings 106 and are emitted from the external cavities, propagate in the z direction as shown in FIG. 3, in parallel to one another until the light beams 120 reach the deflector-condenser lens 210. The incident angles of the light beams 120 incident on the combining grating 110 are defined by the deflector-condenser lens 210. That is, with the deflector-condenser lens 210, the light beams 120 emitted from the external cavities are incident on the combining grating 110 at appropriate incident angles. The light beams that have entered the combining grating 110 are then diffracted at the same diffraction angle and are combined by the combining grating 110.

The laser sources 102 are preferably hermetically sealed as in the first embodiment. For example, an LD in a can-type package may be used for the laser sources 102. Each laser source 102, a corresponding one of collimating parts 104, and a corresponding one of plane transmission gratings 106 may be provided at the same stage to form a module, as in the first embodiment. Additionally, in the present embodiment, the plurality of the laser sources 102 are arranged parallel to the x-axis direction shown in FIG. 3, so that all of the laser sources 102 may be disposed on the same stage. In this case, a lens array corresponding to the arrangement of the laser sources 102 may be used for the collimating part 104. Also, an LD bar in which a plurality of LDs are arranged on the same semiconductor substrate may be used for the plurality of the laser sources 102. In the present embodiment, as in the first embodiment, a cavity length of the external cavity is reduced, which enables the light source device 20 to have a high vibration resistance. Further, according to the present embodiment, the light source device 20 can be easily assembled.

Third Embodiment

Figure 4:
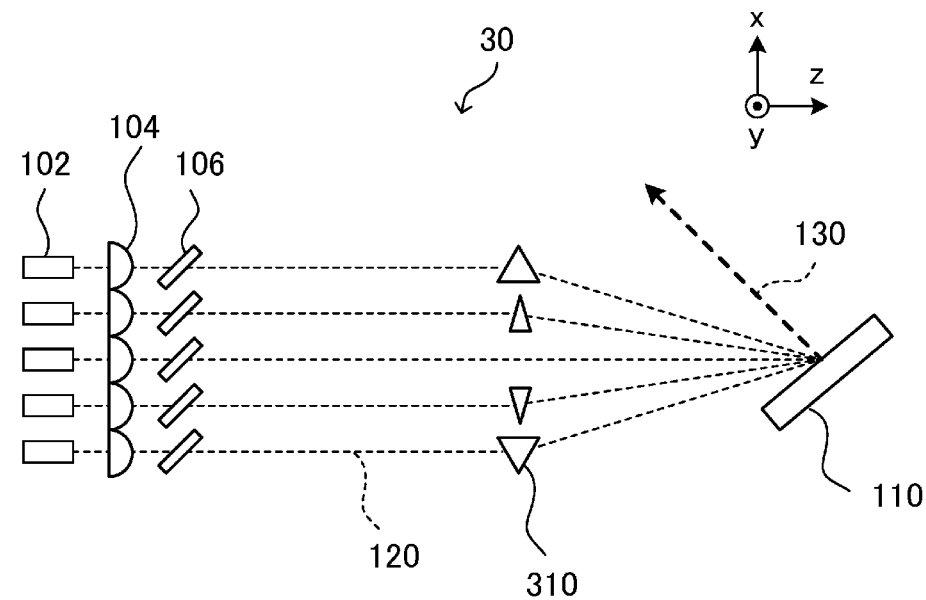
FIG. 4 is a schematic view of a light source device according to a third embodiment of the present invention.

FIG. 4 is a schematic view of a light source device according to a third embodiment of the present invention. A light source device 30 in the present embodiment is a modification of the light source device 20 in the second embodiment. In the present embodiment, members, portions, components, and elements having the same functions as those in the second embodiment are denoted by the same reference numerals as the second embodiment, and duplicative description thereof may be omitted.

The light source device 30 is different from the light source device 20 mainly in that prisms 310 are used instead of a deflector-condenser lens 210. As shown in FIG. 4, five external cavities are provided in the light source device 30, and prisms 310 are disposed each corresponding to a corresponding one of external cavities other than the external cavity at the center. The incident angle of light beam 120 emitted from the external cavity and entering a combining grating 110 is defined by the prism 310 disposed in the optical path between the external cavity and the combining grating 110. That is, with the prisms 310, corresponding ones of the light beams 120 each emitted from a corresponding one of the external cavities are incident on the combining grating 110 at appropriate incident angles. An orientation of the optical path of the light beam 120 emitted from the central external cavity of the plurality of external cavities is not needed to be changed until reaching the combining grating 110, and thus the prism 310 is not disposed on the optical path of the light beam 120 emitted from the central external cavity. The light beams incident on the combining grating 110 at respective incident angles are then diffracted at the same diffraction angle to be combined by the combining grating 110.

In the present embodiment, each single prism 310 is provided with respect to a corresponding one of external cavities except the central external cavity, so that, if an alignment error or the like of the external cavity occurs, a position of the corresponding prism can be individually adjusted to correct an incident position on the combining grating 110. For example, in the case in which a position of a single external cavity is slightly deviated from a predetermined position along the x axis, without correction, the light beam 120 emitted from the external cavity at the deviated position is incident on the combining grating at a different incident angle. This increases a beam parameter product (BPP) of the combined beam 130, which is formed by diffraction and combination on the combining grating 110, resulting in deterioration of quality of the combined beam 130. When such a deviation in position occurs, by adjusting the position of the corresponding prism 310 along the z axis, the incident position of the light beam 120 refracted by the prism 310 incident on the combining grating 110 can be adjusted while maintaining the incident angle. Thus, the deviation of the incident position of the light beam 120 can be corrected.

Fourth Embodiment

Figure 5:
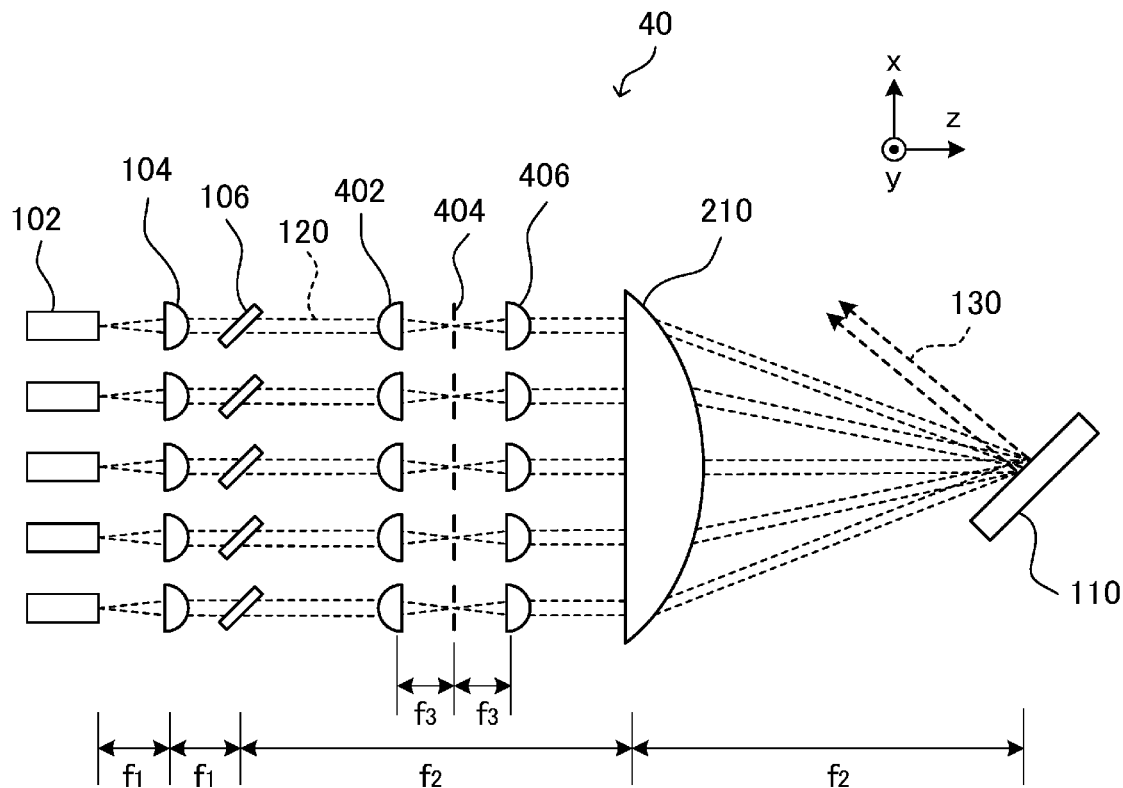
FIG. 5 is a schematic view of a light source device according to a fourth embodiment of the present invention.

FIG. 5 is a schematic view of a light source device according to a fourth embodiment of the present invention. A light source device 40 in the present embodiment is a modification of the light source device 20 in the second embodiment. In the present embodiment, members, portions, components, and elements having the same functions as those in the second embodiment are denoted by the same reference numerals as those in the second embodiment, and the duplicative description thereof may be omitted.

The light source device 40 is different from the light source device 20 mainly in that a condenser lens 402, a diaphragm 404, and a collimating lens 406 are further disposed in this order in an optical path between an external cavity and a combining grating 110. The condenser lens 402, the diaphragm 404, and the collimating lens 406 form an afocal optical system. In the present embodiment, more specifically, the afocal optical system is disposed between a plane transmission grating 106 and a deflector-condenser lens 210. In order to describe the effects of the afocal optical system, each light beam 120 is indicated by a beam having a width in FIG. 5. In FIG. 5, $f_1$ indicates a focal length of a collimating part 104, $f_2$ indicates a focal length of the deflector-condenser lens 210, and $f_3$ indicates focal lengths of the condenser lens 402 and the collimating lens 406.

As shown in FIG. 5, the collimating part 104 is disposed spaced apart from a laser source 102 at a distance of $f_1$, the plane transmission grating 106 is disposed spaced apart from the collimating part 104 at a distance of $f_1$, the deflector-condenser lens 210 is disposed spaced apart from the plane transmission grating 106 at a distance of $f_2$, and the combining grating 110 is disposed spaced apart from the deflector-condenser lens 210 at a distance of $f_2$. The afocal optical system that includes the condenser lens 402 and other optical elements is disposed within the front focal length $f_2$ of the deflector-condenser lens 210.

The light emitted from the laser source 102 has a divergence angle within a certain range. The collimating part 104 collimates the light emitted from the laser source 102 into a substantially parallel light. In order to perform such collimation, a distance along the z axis between the laser source 102 and the collimating part 104 needs to be precisely controlled. As described above, in the case in which the laser source 102 includes the LD configured to emit light having a peak wavelength in a range of 350 nm to 550 nm with a predetermined gain bandwidth, the laser source 102 is preferably hermetically sealed. In view of this, the collimating part 104 can be provided by, for example, with the use of a can-type package, joining a lens to be the collimating part 104 to the can-type package, in which precise control of the distance between the collimating part 104 and the laser source 102 is difficult. Thus, the deviation of position of the collimating part 104 may cause the light beam 120 after passing through the collimating part 104 to be in an undesirable condition.

The afocal optical system disposed between the collimating part 104 and the deflector-condenser lens 210 can correct the condition of the light beam 120 that has passed through the collimating part 104. That is, even the undesirable condition of the light beam 120 that has passed through the collimating part 104 can be converted to the desirable condition by the afocal optical system. Accordingly, a combined beam 130 with a higher quality can be obtained. In other words, the afocal optical system can increase the tolerance of the deviation of position of the collimating part 104.

In the afocal optical system, the light beam 120 is once condensed at the rear focal point by the condenser lens 402. The diaphragm 404 is disposed at the rear focal point. The diaphragm 404 blocks a portion of light that is not well focused by the condenser lens 402, which increases the quality of the light beam 120 that passes through the afocal optical system. Thus, the combined beam 130 with a higher quality and a low BPP can be obtained. Instead of the diaphragm 404, a pinhole may be employed.

Fifth Embodiment

Figure 6:
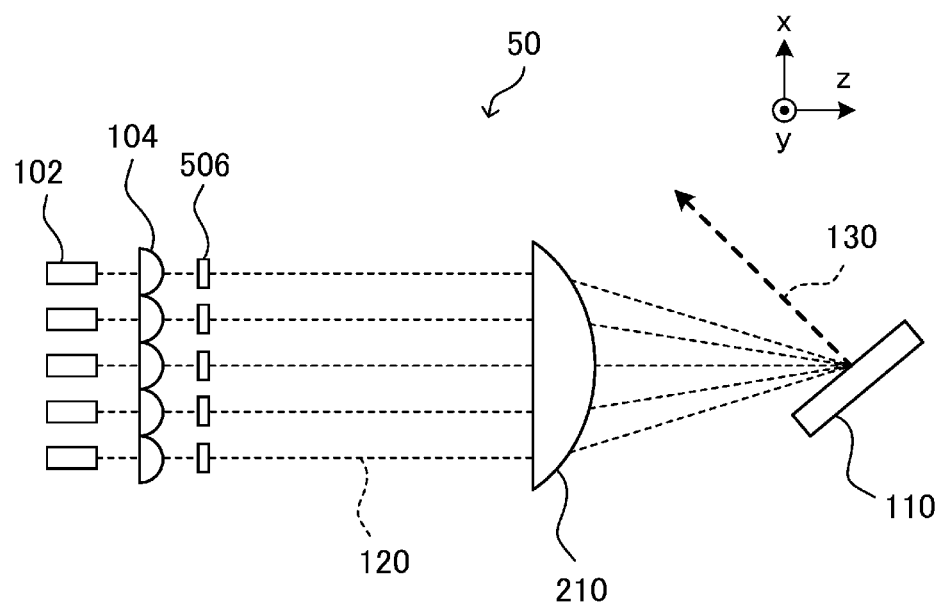
FIG. 6 is a schematic view of a light source device according to a fifth embodiment of the present invention.

FIG. 6 is a schematic view of a light source device according to a fifth embodiment of the present invention. A light source device 50 in the present embodiment is a modification of the light source device 20 in the second embodiment. In the present embodiment, members, portions, components, and elements having the same functions as those in the second embodiment are denoted by the same reference numerals as those in the second embodiment, and duplicative description thereof may be omitted.

The light source device 50 is different from the light source device 20 mainly in that a volume holographic grating 506 is used instead of the plane transmission grating 106 as a wavelength determining element. For the convenience of description, the "volume holographic grating" is also referred to as "VHG" in the present specification. The VHG 506 is disposed in an optical path between a laser source 102 and a combining grating 110. More specifically, the VHG 506 is disposed in the optical path between a collimating part 104 and a deflector-condenser lens 210. The VHG 506 is configured to diffract a portion of light emitted from the laser source 102 back to the laser source 102 to cause external resonance between the laser source 102 and the VHG 506. That is, a combination of the laser source 102, the collimating part 104, and the VHG 506 forms a single external cavity. The cavity length of the external cavity is defined by the distance between the laser source 102 and the VHG 506.

The VHG 506 is configured to diffract only light with the designed wavelength. Accordingly, the wavelength of light that resonates in an external cavity and the wavelength of light that passes through the VHG 506 and that is incident on the combining grating 110 are determined by the VHG 506, to be the designed wavelength of the VHG 506. Light beams 120 each emitted from a corresponding one of the external cavities pass through the deflector-condenser lens 210 and are incident on the combining grating 110 at different incident angles. As described above, in order to allow all of the lights incident on the combining grating 110 to be diffracted at the same diffraction angle, each light beam 120 emitted from a corresponding one of the external cavities needs to have a wavelength corresponding to a corresponding incident angle (refer to Table 1). Thus, the external cavity is provided with VHG 506 having the required designed wavelength. According to the present embodiment, as in the first to fourth embodiments, a cavity length of the external cavity can be reduced, which allows for increasing vibration resistance of the light source device 50. Also, a high precision adjustment is not required during initial assembly, so that the light source device can be easily assembled.

Sixth Embodiment

Figure 7:
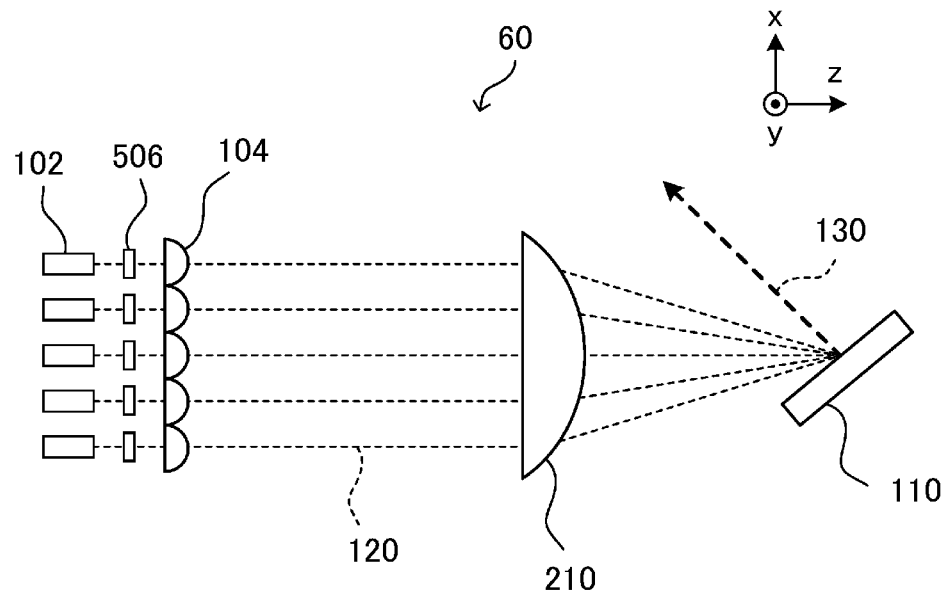
FIG. 7 is a schematic view of a light source device according to a sixth embodiment of the present invention.

FIG. 7 is a schematic view of a light source device according to a sixth embodiment of the present invention. A light source device 60 in the present embodiment is a modification of the light source device 50 in the fifth embodiment. In the present embodiment, members, portions, components, and elements having the same functions as those in the fifth embodiment are denoted by the same reference numerals as those in the fifth embodiment, and duplicative description thereof may be omitted.

The light source device 60 is different from the light source device 50 mainly in that a VHG 506 is disposed between a laser source 102 and a collimating part 104. According to the present embodiment, as in the first to sixth embodiments, a cavity length of the external cavity can be reduced, which allows for increasing vibration resistance of the light source device 60. Further, the distance between the VHG 506 and the laser source 102 is shorter than that in the light source device 50, which allows for increasing the tolerance of angular deviation of the laser source 102 on the x-z plane.

Seventh Embodiment

Figure 8:
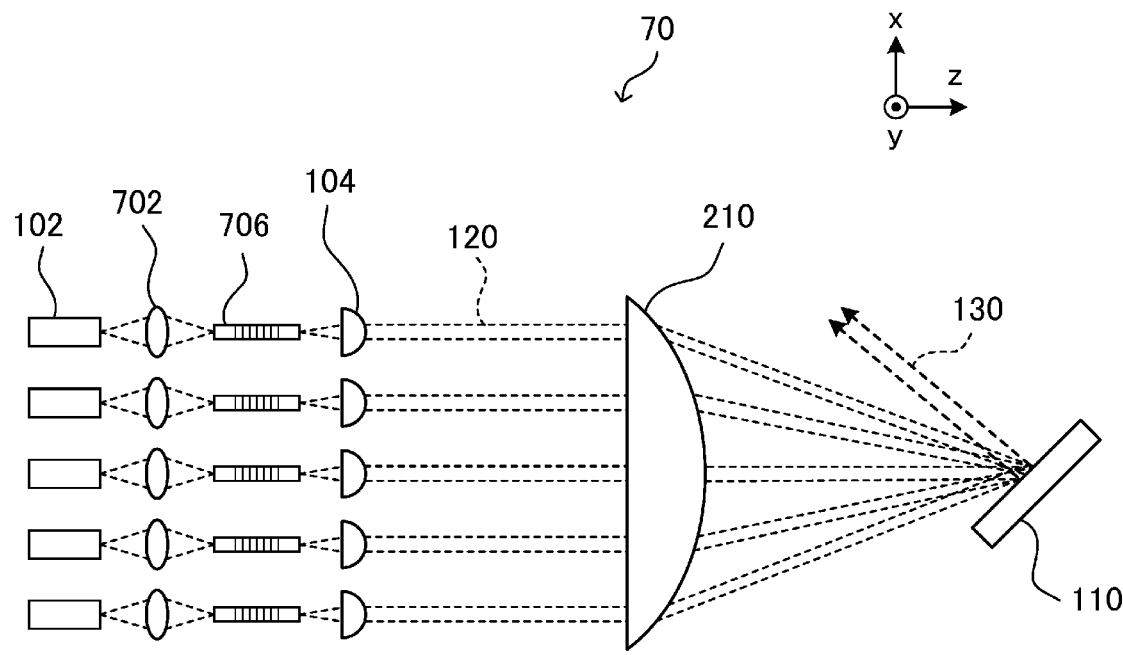
FIG. 8 is a schematic view of a light source device according to a seventh embodiment of the present invention.

FIG. 8 is a schematic view of a light source device according to a seventh embodiment of the present invention. A light source device 70 in the present embodiment is a modification of the light source device 60 in the sixth embodiment. In the present embodiment, members, portions, components, and elements having the same functions as those in the sixth embodiment are denoted by the same reference numerals as those in the sixth embodiment, and duplicative description thereof may be omitted. In FIG. 8, a light beam 120 is shown as a beam having a width for the convenience of description.

The light source device 70 is different from the light source device 60 mainly in that a fiber Bragg grating 706 is used instead of the volume holographic grating 506 as the wavelength determining element. For the convenience of description, the "fiber Bragg grating" is also referred to as a "FBG" in the present specification. The FBG 706 is disposed in an optical path between a laser source 102 and a collimating part 104. A condenser lens 702 is disposed between the laser source 102 and the FBG 706.

The light emitted from the laser source 102 is condensed by the condenser lens 702 and enters the FBG 706. A portion of light emitted from the laser source 102 is diffracted by the FBG 706 back to the laser source 102, and thus external resonance occurs between the laser source 102 and the FBG 706. That is, a combination of the laser source 102, the condenser lens 702, and the FBG 706 forms a single external cavity. The cavity length of the external cavity is defined by the distance between the laser source 102 and the FBG 706.

The FBG 706 diffracts only the light having the Bragg wavelength corresponding to a grating period of the FBG 706, and thus the wavelength of light that resonates in the external cavity and the wavelength of light that passes through the FBG 706 and that enters a combining grating 110 are determined by the FBG 706, to be the Bragg wavelength of the FBG 706. The light beam 120 emitted from the external cavity passes through a deflector-condenser lens 210 and is incident on the combining grating 110 at a different incident angle. As described above, in order to allow all of the lights incident on the combining grating 110 to be diffracted at the same diffraction angle, each light beam 120 emitted from corresponding one of the external cavities needs to have a wavelength corresponding to a corresponding one of the incident angles (refer to Table 1). Thus, each external cavity is provided with the FBG 706 having the required Bragg wavelength. According to the present embodiment, as in the first to sixth embodiments, a cavity length of each external cavity can be reduced, which allows for increasing vibration resistance of the light source device 70. Also, a high precision adjustment is not required during initial assembly, so that the light source device can be easily assembled.

While certain embodiments of the present invention have been described above, it should be understood that the technical scope of the present invention is not limited to the description of those embodiments. Some of the configurations in the described embodiments may be replaced by other configurations, or may be modified. An embodiment based on such changes and modifications may be encompassed in the technical scope of the present invention as clearly indicated in the descriptions of claims. For example, the embodiments described above are described in detail to facilitate understanding of the present invention.
However, the present invention is not necessarily limited to the configurations that include all of the structures and steps described in the embodiments described above.

A portion of a structure of a certain embodiment may be replaced with or added to a structure of another embodiment. For example, the afocal optical system in the light source device 40 shown in FIG. 5 according to the fourth embodiment including the condenser lens 402, the diaphragm 404, and the collimating lens 406 may also be employed in the other embodiments. For example, the afocal optical system may be disposed between each of the external cavity modules 100 and the combining grating 110 in the light source device 10 shown in FIG. 1. In the light source device 30 shown in FIG. 4, the afocal optical system may be disposed between each of external cavities except for the external cavity at the center of the plurality of external cavities and the prism 310, and the afocal optical system may also be disposed between the external cavity at the center and the combining grating 110. The afocal optical system may be disposed between each of the external cavities and the deflector-condenser lens 210 in the light source device 50 shown in FIG. 6. Also, the afocal optical system may be disposed between each of the collimating parts 104 and the deflector-condenser lens 210 in the light source device 60 shown in FIG. 7. Furthermore, the afocal optical system may be disposed between each of the collimating parts 104 and the deflector-condenser lens 210 in the light source device 70 shown in FIG. 8.

Moreover, as in the external cavity modules 100 in the light source device 10, the laser source 102, the collimating part 104, and the VHG 506 in each of the external cavities of the light source device 50 may be formed as a module. Then, in the case in which the light beams 120 each emitted from a corresponding one of the external cavities are incident on the combining grating 110 without using the deflector-condenser lens 210, the incident angle of each of the light beams 120 on the combining grating 110 can be selected and adjusted by selecting the mounting angle of each of the modules that includes the corresponding external cavity. The laser source 102, the VHG 506, and the collimating part 104 in the external cavity of the light source device 60 may be formed as a module. Then, in the case in which the light beams 120 each emitted from a corresponding one of the external cavities are incident on the combining grating 110 without using the deflector-condenser lens 210, the incident angle of each of the light beams 120 on the combining grating 110 can be selected and adjusted by selecting the mounting angle of each of the modules that includes the corresponding external cavity. The laser source 102, the condenser lens 702, the FBG 706, and the corresponding collimating part 104 in each external cavity of the light source device 70 may be formed as a module. Then, in the case in which the light beams 120 each emitted from a corresponding one of the external cavities are incident on the combining grating 110 without using the deflector-condenser lens 210, the incident angle of each of the light beams 120 on the combining grating 110 can be selected and adjusted by selecting the mounting angle of each of the modules that includes the corresponding external cavity.

In the light source devices 50, 60, and 70, prisms 310 shown in FIG. 4 may be used instead of the deflector-condenser lens 210. With such a configuration, if an alignment error or the like of the external cavities occurs, adjustment of corresponding one or more of prism allows individual correction.

What is claimed is:

1. A light source device comprising:
   a plurality of laser sources, each configured to emit a light beam having a peak wavelength in a range of 350 nm to 550 nm with a predetermined gain bandwidth;
   a plurality of collimating parts, each configured to collimate the light beam emitted from a corresponding one of the laser sources;
   a combining grating configured to diffract, at an identical diffraction angle, light beams that have passed through the collimating parts and are incident on the combining grating at different incident angles to combine the diffracted light beams; and
   a plurality of volume holographic gratings, wherein each of the volume holographic gratings is disposed in an optical path between a corresponding one of the laser sources and the combining grating, wherein each of the volume holographic gratings determines a wavelength of the light beam incident on the combining grating, and wherein each of the volume holographic gratings is configured to diffract a portion of the light beam emitted from a corresponding one of the laser sources back to the laser source, to cause external resonance between the corresponding one of the laser sources and each of the volume holographic gratings.

2. The light source device according to claim 1, wherein: the incident angle of each light beam incident on the combining grating is defined by a mounting angle of a corresponding external cavity in which the external resonance occurs.

3. The light source device according to claim 1, further comprising:
   a deflector-condenser lens disposed in optical paths between the combining grating and external cavities in which the external resonance occurs, wherein the deflector-condenser lens is configured to define the incident angle of the light beams incident on the combining grating.

4. The light source device according to claim 1, further comprising:
   a plurality of prisms, each disposed in an optical path between a corresponding external cavity in which the external resonance occurs and the combining grating, wherein the incident angle of the light beams incident on the combining grating is defined by respective ones of the prisms.

5. The light source device according to claim 1, further comprising:
   a plurality of afocal optical systems, each comprising a condenser lens, a diaphragm, and a collimating lens, in this order, and each being disposed in the optical path between each of the external cavities in which the external resonance occurs and the combining grating.

6. The light source device according to claim 1, wherein each of the laser sources comprises a nitride semiconductor and is hermetically sealed.

7. The light source device according to claim 1, wherein the combining grating is a transmission grating.

\* \* \* \* \*